(12) United States Patent
Peethala et al.

(10) Patent No.: US 11,094,527 B2
(45) Date of Patent: Aug. 17, 2021

(54) WET CLEAN SOLUTIONS TO PREVENT PATTERN COLLAPSE

(71) Applicant: INTERNATIONAL BUSINESS MACHINES CORPORATION, Armonk, NY (US)

(72) Inventors: Cornelius B. Peethala, Slingerlands, NY (US); Chih-Chao Yang, Glenmont, NY (US); Raghuveer R. Patlolla, Guilderland, NY (US); Hsueh-Chung Chen, Cohoes, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 132 days.

(21) Appl. No.: 16/156,655

(22) Filed: Oct. 10, 2018

(65) Prior Publication Data
US 2020/0118808 A1   Apr. 16, 2020

(51) Int. Cl.
*H01L 21/02* (2006.01)
*H01L 21/311* (2006.01)

(52) U.S. Cl.
CPC .... *H01L 21/0206* (2013.01); *H01L 21/02063* (2013.01); *H01L 21/31144* (2013.01)

(58) Field of Classification Search
CPC .......... H01L 21/0206; H01L 21/02063; H01L 21/31144
See application file for complete search history.

(56) References Cited

U.S. PATENT DOCUMENTS

| 6,735,555 | B1 | 5/2004 | Suzuki et al. |
| 6,794,294 | B1 | 9/2004 | Zheng et al. |
| 7,011,716 | B2 | 3/2006 | Xu et al. |
| 7,022,610 | B2 | 4/2006 | Chou et al. |
| 7,172,976 | B2 | 2/2007 | Wu |
| 8,617,993 | B2 | 12/2013 | Yasseri et al. |
| 8,828,144 | B2 | 9/2014 | Kumon et al. |
| 2003/0010751 | A1 | 1/2003 | Wu |
| 2004/0124172 | A1 | 7/2004 | Wu |
| 2004/0198066 | A1 | 10/2004 | Verhaverbeke |
| 2005/0136678 | A1 | 6/2005 | Chou et al. |
| 2006/0138399 | A1* | 6/2006 | Itano ................. C11D 7/08 257/40 |
| 2010/0122711 | A1 | 5/2010 | Ryan |
| 2013/0081301 | A1 | 4/2013 | Gouk et al. |

(Continued)

OTHER PUBLICATIONS

Philip G. Clark et al., The Use of Segregated Hydrofluoroethers in Semiconductor Wafer Processing, 2006 IEEE/SEMI Advanced Semiconductor Manufacturing Conference, Jun. 19, 2006, IEEE.

(Continued)

*Primary Examiner* — Natasha N Campbell
(74) *Attorney, Agent, or Firm* — Tutunjian & Bitetto, P.C.; James Nock (57) ABSTRACT

A method for implementing a wet clean process includes cleaning one or more trenches formed in an interlevel dielectric by applying a two-phase cleaning solution. Applying the two-phase cleaning solution includes applying a first component of the two-phase cleaning solution including a diluted acid solution, and reducing capillary force during drying by applying a second component of the two-phase cleaning solution including a chemistry that is less dense than the first component.

20 Claims, 4 Drawing Sheets

(56) References Cited

U.S. PATENT DOCUMENTS

| | | |
|---|---|---|
| 2013/0288484 A1 | 10/2013 | Klipp et al. |
| 2014/0011366 A1 | 1/2014 | Klipp et al. |
| 2014/0144462 A1 | 5/2014 | Verhaverbeke et al. |
| 2015/0101643 A1 | 4/2015 | Kumon et al. |
| 2015/0323871 A1 | 11/2015 | Klipp et al. |
| 2015/0371845 A1 | 12/2015 | Koide et al. |
| 2016/0111329 A1* | 4/2016 | Zhang ............... H01L 21/32135 257/770 |
| 2016/0289455 A1 | 10/2016 | Inaoka et al. |

OTHER PUBLICATIONS

Disclosed Anonymously, Prestressed Tensile Hardmask to Stabilize Pattern Formation in Microelectronics Fabrication, IP.com No. IPCOM000204575D, Mar. 4, 2011, IP.com.

\* cited by examiner

WET CLEAN SOLUTIONS TO PREVENT PATTERN COLLAPSE

BACKGROUND

Technical Field

The present invention generally relates to semiconductor devices, and more particularly to wet clean solutions to prevent pattern collapse.

Description of the Related Art

Integrated circuit processing can be divided into phases including front end of line (FEOL) processing and back end of line (BEOL) processing. FEOL processing refers to the fabrication of individual integrated circuit devices (e.g., transistors, capacitors, resistors). BEOL processing refers to the portion of semiconductor device (e.g., integrated circuit) fabrication where the individual devices are interconnected with conductive wiring (e.g., metal wiring) on the wafer. Generally, BEOL processing includes forming at least one layer of a conductive material (e.g., metallization layer) on the wafer, and etching to remove portions of the at least one layer of conductive material to form the conductive wiring. Multiple layers of conductive material may be needed to complete the integrated circuit, which can be interconnected by creating vias through dielectric layers that function to isolate the conductive wiring to prevent short circuiting. After BEOL processing, post-fabrication processes can be performed, which can include wafer testing, die separation and testing, packaging, etc.

SUMMARY

In accordance an embodiment of the present invention, a method for implementing a wet clean process is provided. The method includes cleaning one or more trenches formed in an interlevel dielectric by applying a two-phase cleaning solution. Applying the two-phase cleaning solution includes applying a first component of the two-phase cleaning solution including a diluted acid solution, and reducing capillary force during drying by applying a second component of the two-phase cleaning solution including a chemistry that is less dense than the first component.

In accordance with another embodiment of the present invention, a method for implementing a wet clean process is provided. The method includes cleaning one or more trenches formed in an interlevel dielectric by applying a two-phase cleaning solution. Applying the two-phase cleaning solution includes applying a first component of the two-phase cleaning solution including a diluted acid solution. The diluted acid solution includes at least one of a hydrofluoric acid solution and a diluted carboxylic acid solution. The method further includes reducing capillary force during drying by applying a second component of the two-phase cleaning solution including a chemistry that is less dense than the first component.

In accordance with yet another embodiment of the present invention, a method for implementing a wet clean process is provided. The method includes cleaning one or more trenches formed in an interlevel dielectric including an ultra low-k dielectric material by applying a two-phase cleaning solution. Applying the two-phase cleaning solution includes applying a first component of the two-phase cleaning solution including a diluted acid solution. The diluted acid solution includes at least one of a hydrofluoric acid solution and a diluted carboxylic acid solution. The method further includes reducing capillary force during drying by applying a second component of the two-phase cleaning solution including a chemistry that is less dense than the first component and includes between four carbon atoms and six carbon atoms, inclusive. The application of the second component results in a surface tension less than about 30 mN/m at about 20° C.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Dielectric pattern collapse or flop-over during BEOL processing, referred to herein as pattern collapse, can occur if the capillary collapse force ("capillary force") exceeds the mechanical restorative force ("restoring force") during drying/rinsing (e.g., local inhomogeneous drying). For example, patterned dielectric deflection can be related to capillary force from/during cleaning using a diluted acid solution (e.g., diluted hydrofluoric acid (dHF)), a geometry of the patterned dielectric material, and material properties of the patterned dielectric material (e.g., moduli such as Young's modulus). The pattern dielectric deflection can be proportional to these factors as follows:

$$\delta \propto \frac{FL}{EA}(AR)^3$$

where $\delta$ refers to the patterned dielectric deflection, F refers to the capillary force, L refers to a combined length of the patterned dielectric material (e.g., a hard mask formed on an interlayer dielectric (ILD)), AR refers to the aspect ratio (e.g., the ratio of the length L and a width W of the patterned dielectric material), E refers to a modulus (e.g., Young's modulus), and A refers to a moment of area (e.g., first moment of area).

To address these and other challenges associated with the integration of ILDs including, e.g., ULK dielectric materials, the embodiments described herein provide for a wet clean process/chemistry that, when applied to clean trenches within an ILD, results in a suitable surface tension to prevent pattern collapse during BEOL processing. Since surface tension is directly proportional to capillary force, the embodiments described herein can be used to reduce capillary force during drying using a diluted acid solution in order to prevent the occurrence of pattern collapse during BEOL processing. Accordingly, the embodiments described herein can reduce defectivity and enhance high-volume manufacturability of devices.

The present embodiments prevent pattern collapse during BEOL processing by adjusting the capillary forces during drying. For example, in one embodiment, a two-phase cleaning solution can include a first component including a diluted acid solution and a second component including a chemistry that is less dense than the first component. The second component, when applied after the first component during cleaning of one or more trenches formed in an interlevel dielectric, can prevent pattern collapse during BEOL processing by reducing capillary forces during drying.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$, where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

Figure 1:
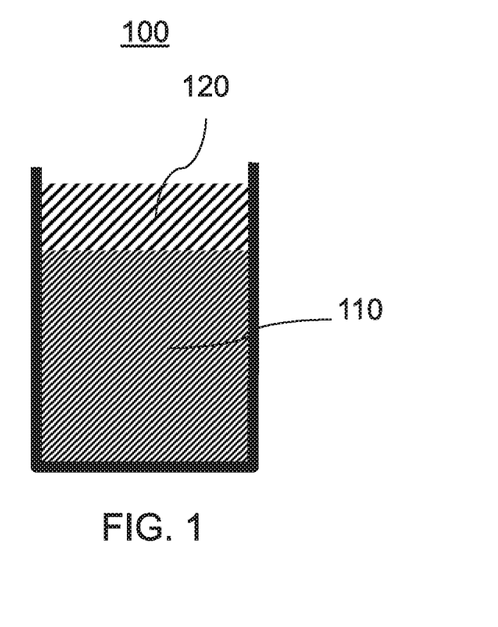
FIG. 1 is a diagram of a cleaning solution, in accordance with an embodiment of the present invention.

The surface tension can enable 22 nm node technology (e.g., about 80 nm pitch) and 15 nm node technology (e.g., about 64 nm pitch, assuming same aspect ratio). Other node sizes and material combination are also contemplated. In one embodiment, the second component 120 of the cleaning solution 100 can include a pore sealing agent.

The following is an illustrative table of chemistries with their corresponding densities, water solubilities, surface tensions and boiling points, including water for reference:

TABLE 1

| Chemistry | Density | Water solubility | Surface tension (at about 20° C.) | Boiling point |
|---|---|---|---|---|
| Water | 1.00 g/cm$^3$ | N/A | 72.7q5 mN/m | 100° C. |
| Isopropyl alcohol | 0.78 g/cm$^3$ | Miscible | <30 mN/m | 82.6° C. |
| Diethyl ether | 0.71 g/cm$^3$ | 6.9 g/100 mL (20° C.) | 16.5 mN/m | 34.6° C. |
| n-butyl alcohol | 0.81 g/cm$^3$ | 9.1 g/100 mL (25° C.) | 24.6 mN/m | 117.73° C. |
| Benzene | 0.88 g/cm$^3$ | 0.18 g/100 mL | <30 mN/m | 80.1° C. |

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Referring now to the drawings in which like numerals represent the same or similar elements, FIG. 1 shows an exemplary cleaning solution 100. The cleaning solution 100 can include a two-phase cleaning solution for two-liquid system cleaning having a first component 110 and a second component 120.

The first component 110 of the cleaning solution 100 can include a diluted acid solution. For example, the diluted acid solution can be prepared using, e.g., deionized water (DI). In one embodiment, the first component 110 of the cleaning solution 100 includes a diluted hydrofluoric acid (HF) solution although other cleaning solutions (e.g., acids) can be employed. For example, the first component 110 of the cleaning solution 100 can include a diluted carboxylic acid (for, e.g., glycolic acid, citric acid) solution. The first component 110 of the cleaning solution 100 can include a surface tension, which under normal conditions can result in pattern collapse by interacting with material along the walls of the trench. In some instances, the first component 110 of the cleaning solution 100 can employ materials with a surface tension of about 46 mN/m (at about 20° C.), although aspects of the present invention can employ materials with other surface tensions.

The second component 120 of the cleaning solution 100 can include a chemistry having at least one compound that can include the following criteria: (1) low solubility relative to water (e.g., a number of carbon atoms is greater than or equal to 4); (2) a density lower than the density of the first component 110; and (3) a surface tension less than the surface tension of the first component 110 of the cleaning solution 100 (e.g., less than about 46 mN/m (at about 20° C.)).

More specifically, to achieve the low solubility relative to water, the chemistry of the second component 120 can include at least one compound having between four carbon atoms and six carbon atoms, inclusive. Moreover, the chemistry of the second component 120 can have a surface tension of, e.g., less than about 30 mN/m (at about 20° C.).

Isopropyl alcohol (also known as isopropanol), which is listed above in Table 1, can generally be used as the second component 120 of the cleaning solution 100. However, isopropyl alcohol has a chemical formula of $C_3H_8O$. Since isopropyl alcohol has fewer than four carbon atoms, isopropyl alcohol is miscible in water (as noted in Table 1). Accordingly, isopropyl alcohol includes properties that are less suitable for use as the second component 120 of the cleaning solution 100 for reducing capillary force during drying in this example, in accordance with the embodiments described herein.

Diethyl ether, which is listed above in Table 1, can be described by the chemical formula $(C_2H_5)_2O$, and can be illustrated by the following structural formula:

N-butyl alcohol (also known as n-butanol or normal butanol), which is listed above in Table 1, can be described by the chemical formula $C_4H_9OH$, and can be illustrated by the following structural formula:

Benzene, which is listed above in Table 1, can be described by the chemical formula $C_6H_6$, and can be illustrated by the following structural formula:

Each of diethyl ether, n-butyl alcohol and benzene can satisfy the criteria for the second component 120 of the cleaning solution 100 in accordance with the embodiments described herein. For example, each of diethyl ether, n-butyl alcohol and benzene has (1) low water solubility; (2) a density less than that of the first component 110 of the cleaning solution 100; (3) a surface tension less than the surface tension of the first component 110 of the cleaning solution 200; and (4) between four carbon atoms and six carbon atoms, inclusive. Therefore, diethyl ether, n-butyl alcohol and benzene each have properties that better lend themselves for use as the second component 120 of the cleaning solution 100, in accordance with the embodiments described herein. Accordingly, in some embodiments, the second component 120 of the cleaning solution 100 can include diethyl ether, n-butyl alcohol, benzene, or combinations thereof.

Figure 2:
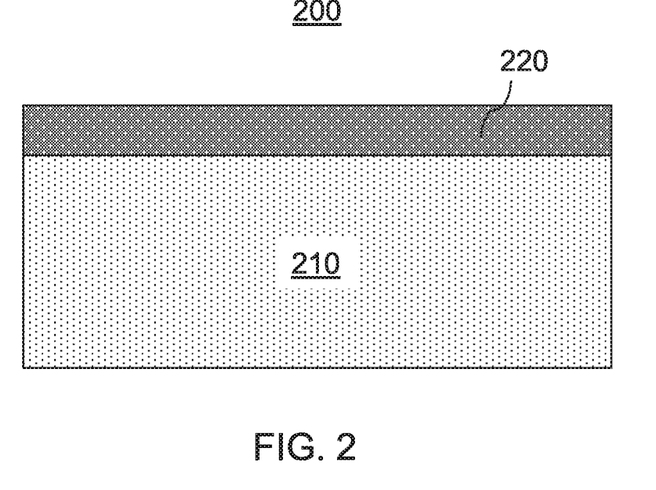
FIG. 2 is a cross-sectional view showing an interlevel dielectric (ILD) and hard mask layer formed during the fabrication of a semiconductor device, in accordance with an embodiment of the present invention.

With reference to FIG. 2, a cross-sectional view is provided illustrating the formation of an interlayer dielectric (ILD) 210 and a hard mask 220 of a device 200.

The ILD 210 can include any suitable dielectric material in accordance with the embodiments described herein. The ILD 210 can be formed using any suitable process in accordance with the embodiments described herein. Examples of suitable processes include, but are not limited to, spin-on deposition, CVD, and PECVD.

In one embodiment, the ILD 210 can include a low-k dielectric material. A low-k dielectric material is a dielectric material that includes a dielectric constant (k) less than about, e.g., 3.9, which corresponds to the dielectric constant of silicon dioxide ($SiO_2$). For example, the ILD 210 can include a dielectric material having a dielectric constant ranging from about 1.1 to about 3.0. In one embodiment, the ILD 210 can include an ultra low-k (ULK) dielectric material (e.g., a dielectric material having dielectric constants less than about 2.2). The ILD 210 can be formed with a low-k dielectric material or an ULK dielectric material to reduce parasitic phenomena such as, e.g., resistance-capacitance delay, crosstalk and power dissipation.

The ULK dielectric material can include any suitable dielectric material in accordance with the embodiments described herein. Examples of suitable ULK dielectric materials can include, but are not limited to, a carbon doped oxide dielectric material (e.g., (porous) SiCOH), a fluorinated silicon oxide material (e.g., SiOF), a carbon doped silicon oxide material, spin-on methyl-silisesquioxane (MSQ), an organic polymer, etc. The thickness of the ULK dielectric material can range from, e.g., about 5 nm to about 200 nm.

The hard mask 220 can have one or more layers and can include any suitable material in accordance with the embodiments described herein. For example, the hard mask 220 can include, e.g., a octomethylcyclotetrasiloxane (OMCTS) film, tetraethyl orthosilicate or tetraethoxysilane (TEOS) film, a silicon nitride film, a titanium nitride film, and/or a titanium oxide film. The thickness of the hard mask 220 can range from, e.g., about 5 nm to about 30 nm. The hard mask can be formed on the ILD using any suitable process in accordance with the embodiments described herein.

Figure 3:
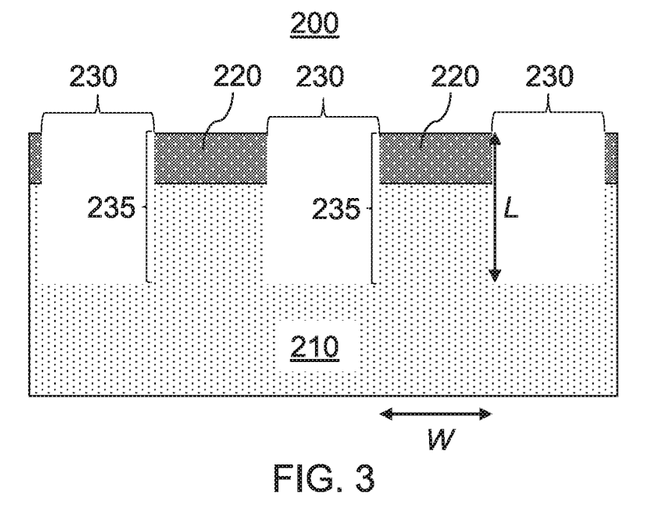
FIG. 3 is a cross-sectional view showing the formation of trenches during the fabrication of the semiconductor device, in accordance with an embodiment of the present invention.

With reference to FIG. 3, a plurality of trenches 230 is formed through the hard mask 220 into the ILD 210. Any suitable processes can be used to form the plurality of trenches 230. For example, patterning can be performed through lithography and etching. Although three trenches 230 are shown in this illustrative example, any number of trenches can be formed in accordance with the embodiments described herein.

As shown, the plurality of trenches 230 correspond to the formation of a plurality of pillars 235 each having a length "L" and a width "W". Each pillar 235 includes an interlayer dielectric (ILD) 210 and a hard mask 220. Accordingly, the length L is a combined length of the ILD 210 and hard mask 220.

Wet cleaning solutions can be used to clean the plurality of trenches 230 during BEOL processing. Integration of ILDs including ULK dielectric materials can be needed to maintain BEOL performance for, e.g., 7 nm technologies and beyond. However, as mentioned above, due to material properties of ULK dielectric materials (e.g., Young's modulus) and tight pitches (e.g., less than about 40 nm), pattern collapse can be an issue for process development associated with cleaning. For example, as mentioned above, the pattern dielectric deflection corresponding to the device 200 can be proportional to these factors as follows:

$$\delta \propto \frac{FL}{EA}(AR)^3$$

where δ refers to the patterned dielectric deflection, F refers to the capillary force, L refers to a combined length of the patterned dielectric material (e.g., the combined length of the ILD 210 and the hard mask 220)), AR refers to the aspect ratio (e.g., the ratio of the length L and the width W), E refers to a modulus (e.g., Young's modulus), and A refers to the moment of area (e.g., first moment of area).

Figure 4:
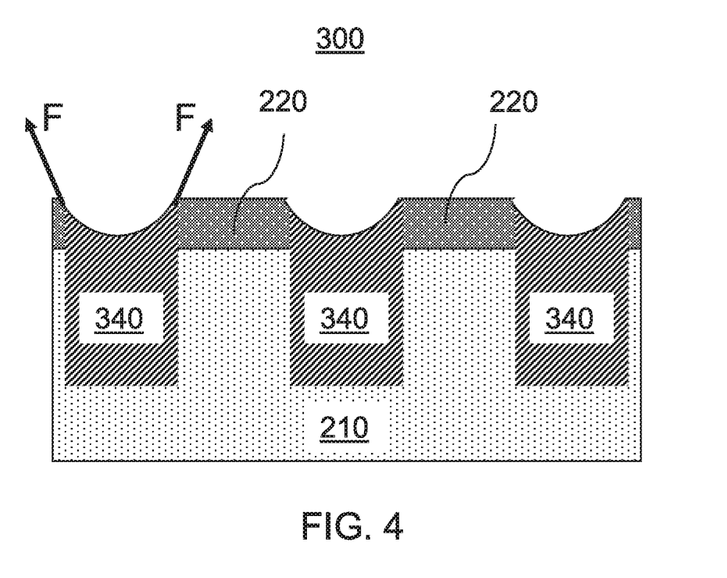
FIG. 4 is a cross-sectional view showing the cleaning of the trenches using a cleaning solution including isopropyl alcohol, in accordance with an embodiment of the present invention.

With reference to FIG. 4, a device 300 is shown illustrating the trenches 230 after a two-phase cleaning solution 340 having a first component including a diluted acid solution and a second component including isopropyl alcohol is applied. The first component of the two-phase cleaning solution 340 can include, e.g., a diluted HF solution and/or a diluted carboxylic acid (for, e.g., glycolic acid, citric acid) solution. It is assumed in this embodiment that the diluted acid solution includes deionized water (DI). Due to the chemical properties of isopropyl alcohol, as described above with reference to FIG. 1, the isopropyl alcohol is miscible with the DI. Moreover, the surface tension corresponding to the two-phase cleaning solution 340 in contact with the hard mask 220 that results from applying the two-phase cleaning solution with isopropyl alcohol, represented by the arrows "F" in FIG. 4, is greater than about 30 mN/m (at about 20° C.).

Figure 5:
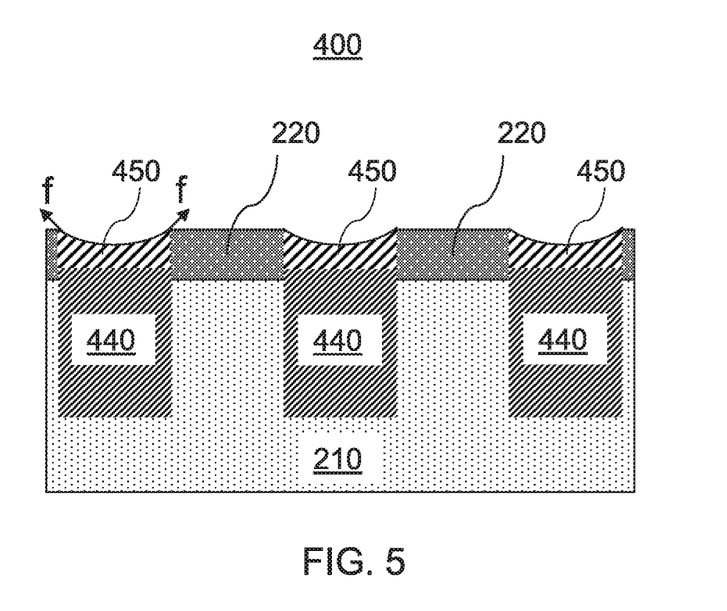
FIG. 5 is a cross-sectional view showing the cleaning of the trenches using a cleaning solution including chemistry A, in accordance with an embodiment of the present invention.

With reference to FIG. 5, a device 400 is shown illustrating the trenches 230 after an application of a two-phase cleaning solution having a first component 440 including a diluted acid solution (e.g., dHF) and a second component 450 including a chemistry having at least one compound that satisfies the following criteria: (1) low solubility relative to water (e.g., a number of carbon atoms is greater than or equal to 4); (2) a density lower than the density of the first component of the two-phase cleaning solution 440; and (3) a surface tension less than the surface tension of the first component of the two-phase cleaning solution 440 (e.g., less than about 46 mN/m (at about 20° C.)).

More specifically, to achieve the low solubility relative to water, the chemistry of the second component 420 can include at least one compound having between four carbon atoms and six carbon atoms, inclusive. Moreover, the chemistry of the second component 120 can have a surface tension of, e.g., less than about 30 mN/m (at about 20° C.). In one embodiment, the second component 120 of the cleaning solution 100 can include a pore sealing agent.

In the embodiment where the diluted acid solution of the first component 440 includes a dHF solution, the water solubility of the second component 450 can be less than about 10 g/100 mL. Since the density of the second component 450 is less than the density of the first component 440 and has a low solubility relative to water, the second component 450 floats to the top of the two-phase cleaning solution and is in contact with the hard mask 220.

Figure 6:
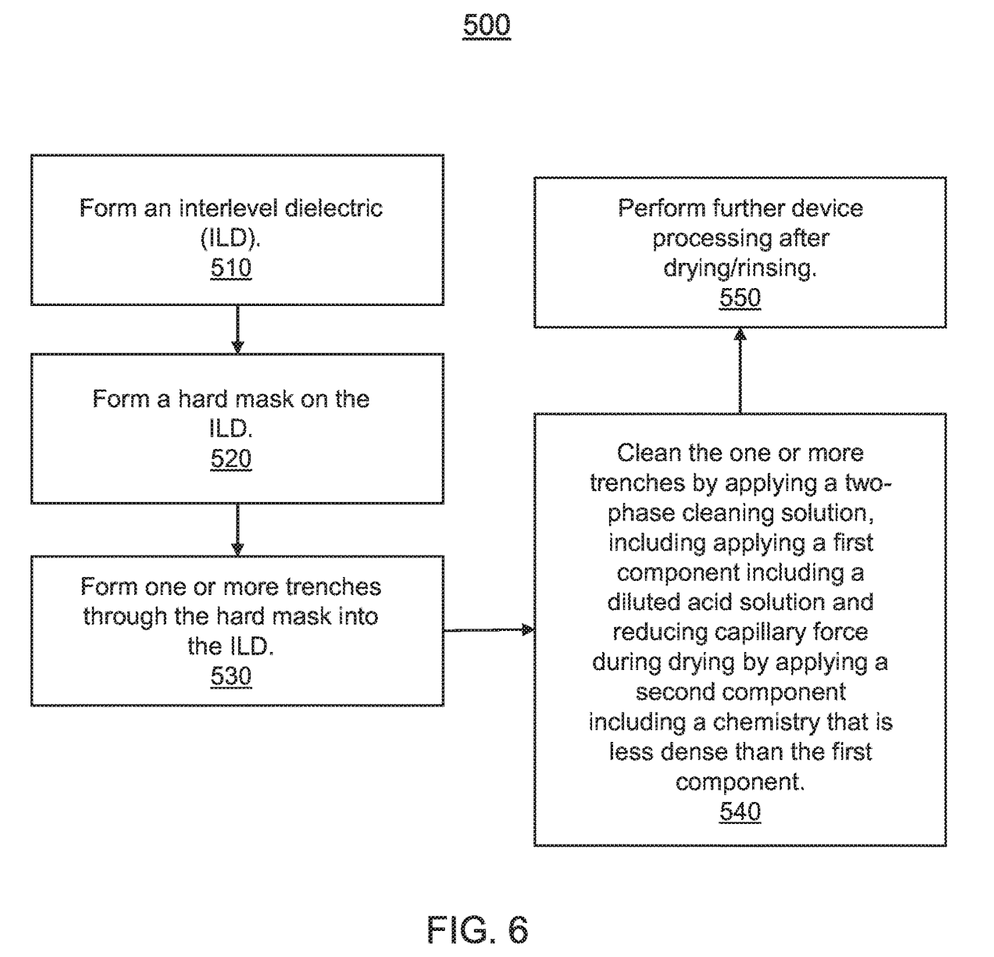
FIG. 6 is a block/flow diagram showing a system/method implementing a wet clean process to prevent pattern collapse, in accordance with an embodiment of the present invention.

The slope of the curvature of the surface of the second component 450 of the two-phase cleaning solution shown in FIG. 6, which corresponds to the surface tension that results from applying the two-phase cleaning solution with the second component 450, is represented by arrows "f" in FIG. 5. As can be seen, the slope of the curvature of arrows "f" is less than the slope of the curvature of the arrows "F" corresponding to the surface tension of the two-phase cleaning solution 340 including isopropyl alcohol described above with reference to FIG. 5. Since the surface tension is related to capillary force during drying (e.g., local inhomogeneous drying), the lower surface tension that results from using the second component 450 in FIG. 5 corresponds to a reduction of capillary force during drying as compared to the use of isopropyl alcohol in the two-phase cleaning solution 340 in FIG. 4. Accordingly, applying a two-phase cleaning solution having a second component including at least one compound that satisfies the following criteria: (1) low solubility relative to water (e.g., a number of carbon atoms is greater than or equal to 4); (2) a density lower than the density of the first component of cleaning solution; and (3) a surface tension less than the surface tension of a first component of the cleaning solution, can prevent pattern collapse during BEOL processing in accordance with the embodiments described herein by, e.g., reducing the capillary force during drying (e.g., local inhomogeneous drying).

After the cleaning in accordance with FIG. 5, one or more atomic layers can be detected in the plurality of trenches 330 (not shown). The one or more atomic layers can include at least one traceable compound resulting from the application of the two-phase cleaning solution. For example, at least one of a phenyl group ($C_6H_5$—) compound and a methyl group ($CH_3$—) compound can be detected in the plurality of trenches 330.

Further downstream processing can be performed on the device (not shown). For example, additional BEOL processing, such as the deposition of a diffusion barrier layer and the formation of a plurality of interconnects within respective ones of the plurality of trenches, and post-fabrication processing (e.g., wafer testing, wafer dicing, wafer testing and packaging) can be performed. Examples of suitable materials for the diffusion barrier layer can include metals such as, e.g., a tantalum (Ta), titanium (Ti), ruthenium (Ru), tungsten (W), nickel (Ni), hafnium (Hf), niobium (Nb), zirconium (Zr), cobalt (Co) and/or vanadium (V), and/or conductive ceramic materials such as, e.g., a tantalum nitride (e.g., TaN), a titanium nitride (e.g., TiN), a tungsten nitride (e.g., WN) and/or an indium oxide (e.g., $In_2O_3$). Examples of suitable conductive materials for the one or more interconnects can include, but are not limited to, copper (Cu), cobalt (Co), ruthenium (Ru), aluminum (Al), etc.

With reference to FIG. 6, a block/flow diagram is provided illustrating an exemplary system/method 500 for implementing a wet clean process including a two-phase cleaning solution to prevent pattern collapse during BEOL processing.

At block 510, an interlevel dielectric (ILD) is formed. The ILD can be formed using any suitable process in accordance with the embodiments described herein. Examples of suitable processes include, but are not limited to, spin-on deposition, CVD, and PECVD.

In one embodiment, the ILD can include a low-k dielectric material. A low-k dielectric material is a dielectric material that includes a dielectric constant (k) less than about 3.9, which corresponds to the dielectric constant of $SiO_2$. For example, the ILD can include a dielectric material having a dielectric constant ranging from about 1.0 to about 3.0. In one embodiment, the ILD can include an ULK dielectric material. The ILD can be formed with a low-k dielectric material or an ULK dielectric material to reduce parasitic phenomena such as, e.g., resistance-capacitance delay, crosstalk and power dissipation.

The ULK dielectric material can include any suitable dielectric material in accordance with the embodiments described herein. Examples of suitable ULK dielectric materials can include, but are not limited to, a carbon doped oxide dielectric material (e.g., (porous) SiCOH), a fluorinated silicon oxide material (e.g., SiOF), a carbon doped silicon oxide material, spin-on methyl-silisesquioxane (MSQ), an organic polymer, etc. The thickness of the ULK dielectric material can range from, e.g., about 5 nm to about 200 nm.

At block 520, a hard mask having one or more layers is formed on the ILD. The hard mask can include any suitable material(s) in accordance with the embodiments described herein. For example, the hard mask can include at least one of an octomethylcyclotetrasiloxane (OMCTS) hard mask layer and a tetraethyl orthosilicate or tetraethoxysilane (TEOS) hard mask layer. The hard mask can be formed on the ILD using any suitable process in accordance with the embodiments described herein.

At block 530, one or more trenches are formed through the hard mask into the ILD. Any suitable processes can be used to form the one or more trenches. For example, forming the one or more trenches can include performing patterning through lithography and etching. The one or more trenches correspond to one or more respective interconnects.

At block 540, the one or more trenches are cleaned by applying a two-phase cleaning solution, including applying a first component including a diluted acid solution, and reducing capillary force during drying by applying a second component including a chemistry that is less dense than the first component. For example, the first component of the two-phase cleaning solution can include an acid diluted with deionized water (DI). In one embodiment, the diluted acid solution can include a diluted hydrofluoric acid (HF) solution. In another embodiment, the diluted acid solution can include a diluted carboxylic acid (for, e.g., glycolic acid, citric acid) solution The second component of the two-phase cleaning solution can include a chemistry having at least one compound that satisfies the following criteria: (1) low solubility relative to water (e.g., a number of carbon atoms is greater than or equal to 4); (2) a density lower than the density of the first component 110; and (3) a surface tension less than the surface tension of the first component 110 of the cleaning solution 100. In one embodiment, the surface tension is less than, e.g., about 46 mN/m (at 20° C.)).

More specifically, to achieve the low solubility relative to water, the chemistry of the second component 120 can include at least one compound having between four carbon atoms and six carbon atoms, inclusive. Moreover, the chemistry of the second component 120 can have a surface tension of, e.g., less than about 30 mN/m (at about 20° C.). The surface tension can enable 22 nm node technology (e.g., about 80 nm pitch) and 15 nm node technology (e.g., about 64 nm pitch, assuming same aspect ratio). Other node sizes and material combination are also contemplated. In one embodiment, the second component 120 of the cleaning solution 100 can include a pore sealing agent.

Further details regarding the two-phase cleaning solution applied at block 540 are described above with reference to FIG. 2.

After applying the two-phase cleaning solution, one or more atomic layers can be detected in the one or more trenches. The one or more atomic layers can include at least one traceable compound resulting from the application of the two-phase cleaning solution. For example, at least one of a phenyl group ($C_6H_5$—) compound and a methyl group ($CH_3$—) compound can be detected in the one or more trenches.

At block 550, further device processing can be performed after drying/rinsing. As mentioned above, the two-phase cleaning solution reduces the capillary force during drying, thereby preventing pattern collapse during BEOL processing. The further device processing can include additional BEOL processing. For example, the further device processing can include deposition of a diffusion barrier layer and the formation of a plurality of interconnects within respective ones of the plurality of trenches, and post-fabrication processing (e.g., wafer testing, wafer dicing, wafer testing and packaging) can be performed. Examples of suitable materials for the diffusion barrier can include metals such as, e.g., a tantalum (Ta), titanium (Ti), ruthenium (Ru), tungsten (W), nickel (Ni), hafnium (Hf), niobium (Nb), zirconium (Zr), cobalt (Co) and/or vanadium (V), and/or conductive ceramic materials such as, e.g., a tantalum nitride (e.g., TaN), a titanium nitride (e.g., TiN), a tungsten nitride (e.g., WN) and/or an indium oxide (e.g., $In_2O_3$). Examples of suitable conductive materials for the one or more interconnects can include, but are not limited to, copper (Cu), cobalt (Co), ruthenium (Ru), aluminum (Al), etc.

The embodiments described herein provide for a wet clean process/chemistry that, when applied to clean trenches within an ILD, results in a suitable surface tension to prevent pattern collapse during BEOL processing. Since surface tension is directly proportional to capillary force, the embodiments described herein can be used to reduce capillary force during drying using a diluted acid solution (e.g., dHF) in order to prevent the occurrence of pattern collapse during BEOL processing. Accordingly, the embodiments described herein can reduce defectivity and enhance high-volume manufacturability of devices.

Having described preferred embodiments of wet clean solutions to prevent pattern collapse (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed:

1. A method for implementing a wet clean process, comprising:
    for a semiconductor device associated with a technology node of less than or equal to 22 nm, cleaning one or more trenches formed in an interlevel dielectric by applying a two-phase cleaning solution to prevent pattern collapse during back-end-of-line (BEOL) processing of the semiconductor device, including:
        applying a first component of the two-phase cleaning solution including a diluted acid solution; and
        reducing capillary force during drying by applying a second component of the two-phase cleaning solution including a chemistry that is less dense than the first component.

2. The method of claim 1, wherein the first component includes at least one of a diluted hydrofluoric acid solution and a diluted carboxylic acid solution.

3. The method of claim 1, wherein the chemistry of the second component includes at least one compound having between four carbon atoms and six carbon atoms, inclusive.

4. The method of claim 1, wherein the chemistry of the second component includes at least one compound selected from the group consisting of: diethyl ether, n-butyl alcohol, benzene, and combinations thereof.

5. The method of claim 1, wherein the one or more trenches correspond to one or more respective interconnects.

6. The method of claim 1, wherein the application of the second component results in a surface tension that is less than about 46 mN/m at about 20° C.

7. The method of claim 6, wherein the application of the second component results in a surface tension that is less than about 30 mN/m at about 20° C.

8. The method of claim 1, further comprising:
    forming the interlevel dielectric;
    forming a hard mask on the interlevel dielectric; and
    forming the one or more trenches in the interlevel dielectric through the hard mask.

9. The method of claim 8, wherein forming the interlevel dielectric includes forming the interlevel dielectric to include an ultra low-k dielectric material.

10. A method for implementing a wet clean process using a two-phase cleaning solution to prevent pattern collapse during back-end-of-line (BEOL) processing, comprising:
    for a semiconductor device associated with a technology node of less than or equal to 22 nm, forming at least two pillars separated by a trench from a dielectric material;
    cleaning the trench by applying a two-phase cleaning solution to prevent pattern collapse of the at least two pillars during back-end-of-line (BEOL) processing of the semiconductor device, including;
        applying a first component of the two-phase cleaning solution including a diluted acid solution, the diluted acid solution including at least one of a diluted hydrofluoric acid solution and a diluted carboxylic acid solution; and
        reducing capillary force during drying by applying a second component of the two-phase cleaning solution including a chemistry that is less dense than the first component.

11. The method of claim 10, wherein the chemistry of the second component includes at least one compound having between four carbon atoms and six carbon atoms, inclusive.

12. The method of claim 10, wherein the chemistry of the second component includes at least one compound selected from the group consisting of: diethyl ether, n-butyl alcohol, benzene, and combinations thereof.

13. The method of claim 10, wherein the one or more trenches correspond to one or more respective interconnects.

14. The method of claim 10, wherein the application of the second component results in a surface tension that is less than about 46 mN/m at about 20° C.

15. The method of claim 14, wherein the application of the second component results in a surface tension that is less than about 30 mN/m at about 20° C.

16. The method of claim 10, further comprising:
forming an interlevel dielectric including the dielectric material;
forming a hard mask on the interlevel dielectric; and
forming the at least two pillars separated by the trench from the interlevel dielectric through the hard mask.

17. The method of claim 16, wherein forming the interlevel dielectric includes forming the interlevel dielectric to include an ultra low-k dielectric material.

18. A method for implementing a wet clean process using a two-phase cleaning solution to prevent pattern collapse during back-end-of-line (BEOL) processing, comprising:
for a semiconductor device associated with a technology node of less than or equal to 22 nm and having sub-80 nm pitches, forming at least two pillars separated by a trench from an ultra low-k dielectric material;
cleaning the trench by applying a two-phase cleaning solution to prevent pattern collapse of the at least two pillars during back-end-of-line (BEOL) processing of the semiconductor device, including:
applying a first component of the two-phase cleaning solution including a diluted acid solution, the diluted acid solution including at least one of a diluted hydrofluoric acid solution and a diluted carboxylic acid solution; and
reducing capillary force during local inhomogeneous drying by applying a second component of the two-phase cleaning solution including a chemistry that is less dense than the first component and includes between four carbon atoms and six carbon atoms, inclusive, the application of the second component resulting in a surface tension less than about 30 mN/m at about 20° C.

19. The method of claim 18, wherein the chemistry of the second component includes at least one compound selected from the group consisting of: diethyl ether, n-butyl alcohol, benzene, and combinations thereof.

20. The method of claim 18, further comprising:
forming an interlevel dielectric including the ultra low-k dielectric material;
forming a hard mask on the interlevel dielectric; and
forming the at least two pillars separated by the trench from the interlevel dielectric through the hard mask.

* * * * *